United States Patent
Lapid

(10) Patent No.: US 6,687,489 B1
(45) Date of Patent: Feb. 3, 2004

(54) IMPLEMENTING RF POWER MEASUREMENTS IN A BROADBAND COMMUNICATIONS DEVICE

(75) Inventor: Adam Lapid, Shoham (IL)

(73) Assignee: Texas Instruments Incorporated, Dallas, TX (US)

( * ) Notice: Subject to any disclaimer, the term of this patent is extended or adjusted under 35 U.S.C. 154(b) by 483 days.

(21) Appl. No.: 09/713,493

(22) Filed: Nov. 15, 2000

Related U.S. Application Data
(60) Provisional application No. 60/165,725, filed on Nov. 15, 1999.

(51) Int. Cl.[7] .......................... H04B 17/00; H04B 1/06; H03G 3/30
(52) U.S. Cl. .................. 455/226.1; 455/67.11; 455/150.1; 455/232.1; 330/278; 330/289
(58) Field of Search .................. 455/67.11, 67.14, 455/77, 120, 150.1, 154.1, 184.1, 226.1, 227, 232.1, 234.1, 237.1, 239.1, 245.1, 246.1, 250.1; 334/5, 6, 14; 330/305, 289, 278, 266, 272

(56) References Cited

U.S. PATENT DOCUMENTS
6,052,031 A * 4/2000 Ao et al. .................... 330/289
6,359,498 B1 * 3/2002 Kurihara et al. ............ 327/513
6,496,017 B2 * 12/2002 Bhat .......................... 324/616

FOREIGN PATENT DOCUMENTS
EP 1267488 A2 * 12/2002 ............ H03G/3/30

\* cited by examiner

*Primary Examiner*—Duc M. Nguyen
(74) *Attorney, Agent, or Firm*—Frederick J. Telecky, Jr.; W. James Brady, III

(57) ABSTRACT

The invention provides systems, methods, and devices that compensate for temperature, frequency, and sampling effects in a broadband communication device's power measurements. One embodiment of a system includes a thermal device, and an automatic gain control circuit coupled to the thermal device. One method includes the acts of disabling a TOP operation, setting a RF input power, reading an AGC GAIN value, and setting the broadband communications device based on the read AGC value. Furthermore, a broadband communications device according to the invention may operate by disabling a TOP operation, setting a RF input power, reading an AGC GAIN value, and setting the broadband communications device based on the read AGC value.

10 Claims, 3 Drawing Sheets

IMPLEMENTING RF POWER MEASUREMENTS IN A BROADBAND COMMUNICATIONS DEVICE

RELATED APPLICATIONS

This application claims the benefit of U.S. Provisional Application Ser. No. 60/165,725, filed Nov. 15, 1999, which is hereby incorporated by reference in its entirety.

TECHNICAL FIELD OF THE INVENTION

This invention relates generally to broadband communications, and more specifically, the invention relates to a method, system, and apparatus for implementing RF power measurements in a broadband communications device, such as a DOCSIS compliant cable modem. The invention is applicable to at least those broadband devices comprising the LBTXXXXPHY chip family.

BACKGROUND OF THE INVENTION

The newer DOCSIS standards, such as ECO, recommend that Broadband Communication Devices (BCDs) have the ability to measure the power of an input RF signal. Particularly, this feature recommended in DOCSIS 1.0 and requires this feature in DOCKS 1.1. Measurement accuracy should be within 3 dBmV of real input power. Controller Modules (CMs) which incorporate a low cost single conversion tuner in their front-end solution suffer from a relatively large gain variance as the temperature and frequency change. In fact, the overall gain variance may be as large as +/−10 dB. This makes power measurement difficult.

One Broadband Communication device, the LBT403OPHY, uses a Take Over Point (TOP) scheme for controlling AGC circuits in a CM. The invention provides solutions that enable accurate power measurement in a BCD, using the qualities of the TOP scheme.

SUMMARY OF THE INVENTION

The invention provides technical advantages as systems, methods, and devices that compensate for temperature, frequency, and sampling effects in a broadband communication device's power measurements. One embodiment of a system includes a thermal device, and an automatic gain control circuit coupled to the thermal device such that the thermal device is enabled to compensate for variances in the automatic gain control circuit.

In another embodiment, the method includes the acts of disabling a TOP operation, setting a RF input power, reading an AGC GAIN value, and setting the broadband communications device based on the read AGC value. Furthermore, a broadband communications device according to the invention may operate by disabling a TOP operation, setting a RF input power, reading an AGC GAIN value, and setting the broadband communications device based on the read AGC value.

DESCRIPTION OF THE DRAWINGS

The aforementioned features, and other features of the invention, will be apparent to those skilled in the art from the following detailed description. The detailed description is better understood, and should be read in conjunction with, the accompanying drawings, in which.

DETAILED DESCRIPTION OF PREFERRED EMBODIMENTS

A Take Over Point (TOP) is a separation point between a Radio Frequency (RF), Automatic Gain Control (AGC), and IF AGC control. If the TOP can be correlated well with a constant input power over a frequency range, a temperature range, and samples, a point exists within the DOCSIS defined input power range which divides the input power (Pin) into two sections:

1. Pin<=TOP power; and
2. Pin>TOP power at which the power is known.

The TOP power is attributed to an 'AGC GAIN' value in a broadband communication device's (such as a LBT4030's) registers. Therefore, the 'AGC GAIN' value at TOP represents a known power level. If a 'Gain Reduction vs. AGC GAIN register value' response is generated, the input RF power from the AGC gain register value may be predicted. The span division by itself reduces the practical error by reducing the optional input power range for a given 'AGC GAIN' value.

It is helpful to consider that the division of an input power span influences different properties for each power range:

1. Pin<=TOP power: this power range is frequency natural, and the primary contributors to variance are temperature and sample; and
2. Pin >TOP power: this power range is frequency influenced. Both tuner gain, and RF AGC GAIN reduction response vary with frequency as well as temperature and power.

MAINTAINING CONSTANT TOP POWER (TEMPERATURE AND FREQUENCY)

One solution for Lowering Temperature Effects of the RF/IF Path on the TOP

Assuming the use of a temperature independent Operational Amplifier (Op Amp) AGC interface circuit implemented in [a BCD] (such as a LBT403OPHY, 400D or 400E), the gain variance in the RF/IF signal path across different temperatures causes changes to the AGC GAIN register. In order to minimize the temperature effects on the system, a temperature compensation component should be included in the AGC loop.

A simple way to implement a temperature compensation component is to add a thermal device (RT) in an AGC interface circuit. The thermal device varies the gain in reverse polarity (inversely) to the IF/RF gain change over temperature. For example, a thermistor device may be added in parallel or series to a bias circuit such as RT 150 shown in FIG. 1 (this setting is appropriate for a non-inverting AGC interface circuit. Other cases, such as an inverting case, require different RT 150 placements, as is known in the art.)

Figure 1:
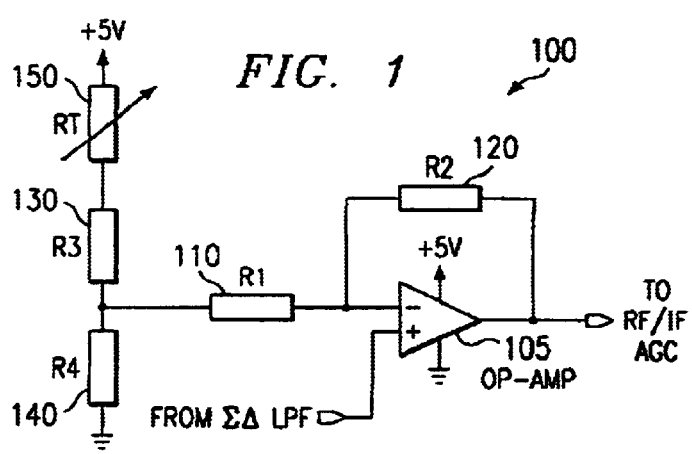
FIG. 1 is an AGC interface amplification circuit with temperature compensation.

FIG. 1 is an AGC interface amplification circuit 100 with temperature compensation provided by a thermal device 150. The AGC interface amplification circuit 100 includes a bias circuit portion having an operational amplifier 105, a first resistor R1 110, a second resistor R2 120, a third resistor R3 130, and a fourth resistor R4 140, each of which is illustrated in FIG. 1.

When the RF/IF gain has an inverted relationship to the temperature, with a non-inverting AGC polarity, a PTC (Positive Temperature Coefficient) device may be appropriate for RT 150. For example, any gain reduction due to a temperature increase in turn decreases the negative bias. This increases the output voltage of the interface circuit, thus keeping the AGC gain value constant (and thus deriving a constant TOP for a given input power).

This method of compensation may be used in any other amplification circuitry, however, temperature response of other amplification devices, such as Bi-polar transistors, should be taken into account. This compensation may be added to an IF interface circuit, or to an IF and RF interface circuitry.

Alternative IF circuit compensation

Supplementing an IF section with a thermal device is less expense than using a single thermal device. Because such compensation changes the chain budget and may cause degradation (to NF on SFDR), the chain performance of the tuner should be checked in all cases. Dual compensation (IF and IR) may ensure a stable chain budget. However, because the IF and RF GC's have different responses, tuning gain over temperature, requires non-linear circuitry.

The Thermal device RT 150 must have specific resistive qualities: ambient resistive accuracy, PTC/NTC, temperature coefficient, and dissipation constant. Ambient resistive accuracy should be about 1% as large as any resistor in the circuit, to lower gain errors. PTC/NTC is secured by using a RT having a positive coefficient. If using a NTC1 device, it would be located in conjunction with R4 140. In addition, the temperature coefficient of RT 150 has a curve matched to tuner's gain across a temperature range. The tolerance of the device should be accounted for, as well as a reasonable error. In many cases a linear approximation may be made to the tuner's response. If an approximation is made, then the RT 150 should be linear as well. Furthermore, the RT's dissipation constant (the power dissipated in RT 150) should either be negligible in the temperature budget, or calculated out.

Illustrative Device

Figure 2:
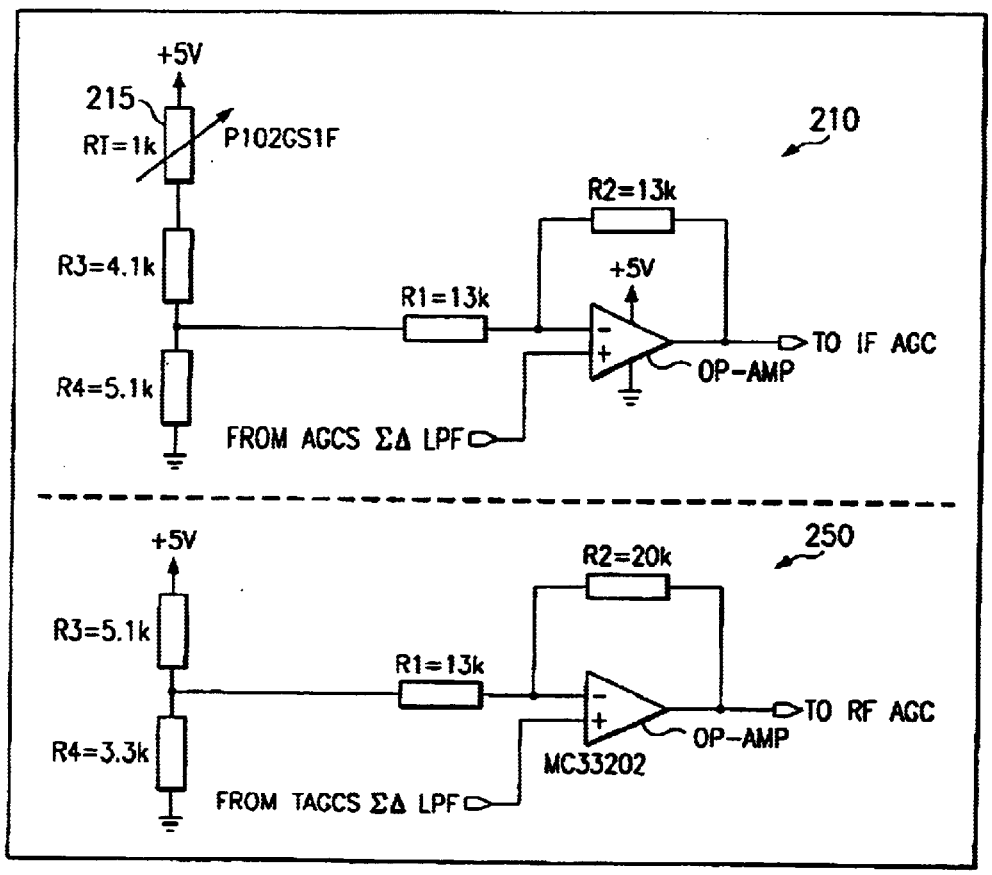
FIG. 2 shows an IF and RF AGC interface amplifier circuit with temperature compensation.

For the following example, a P102GS1F (from U.S. SENSOR) uses an accurate 1 kOhm resistor, with a near linear temperature response that corresponds with the near linear IF AGC GR response in the relevant span. This example is based specifically on the LBT403OPHY reference design (LBT4030), using Toshiba's CVA8XMA single conversion tuner and an AGC interface circuit shown in FIG. 2. Accordingly, FIG. 2 shows an IF and RF AGC interface amplifier circuit with temperature compensation. Provided in the IF AGC interface 210 is a thermal device 215. In addition, the RF ACG 250 includes compensation considerations. Since the specifics of the IF and RF ACG interfaces 210, 250 are discussed in detail in the available AN-LBT403OPHY-01 standard, which is incorporated by reference herein (accordingly, details discussed in the AN-LBT403OPHY-01 standard are omitted from this discussion). However, it should be understood that the same design principles and considerations are applicable to many other specific embodiments.

Tuner Properties

Temperature Drift

Assuming a linear approximation in the tuner's gain drift across temperatures of −0.08 dB/C (for ambient temperatures of about −10 to about +60 degrees C.) the gain variance is about +/−2.8 dB relative to 25 degrees C. (approximately room temperature). Actual designs should consider the temperature inside the closed cable modem case.

AGC GAIN Response

Figure 3:
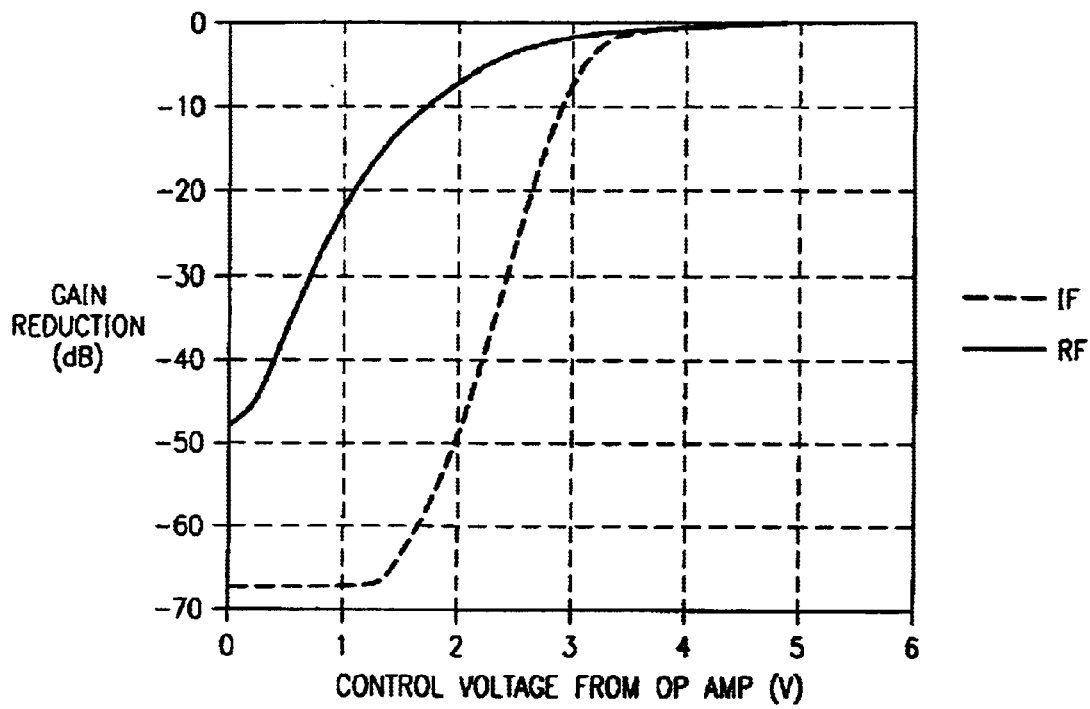
FIG. 3 illustrate CVA8XMA IF and RF AGC gain response to control voltage at a single frequency.

The CVA8XMA's gain response for a single frequency is given in FIG. 3. Thus, FIG. 3 illustrates IF and RF AGC gain response for the CVA8XMA relative to control voltage (horizontal axis), at a single frequency. Gain reduction in FIG. 3 is illustrated on the vertical axis.

AGC Interface Circuit Properties

Figure 4:
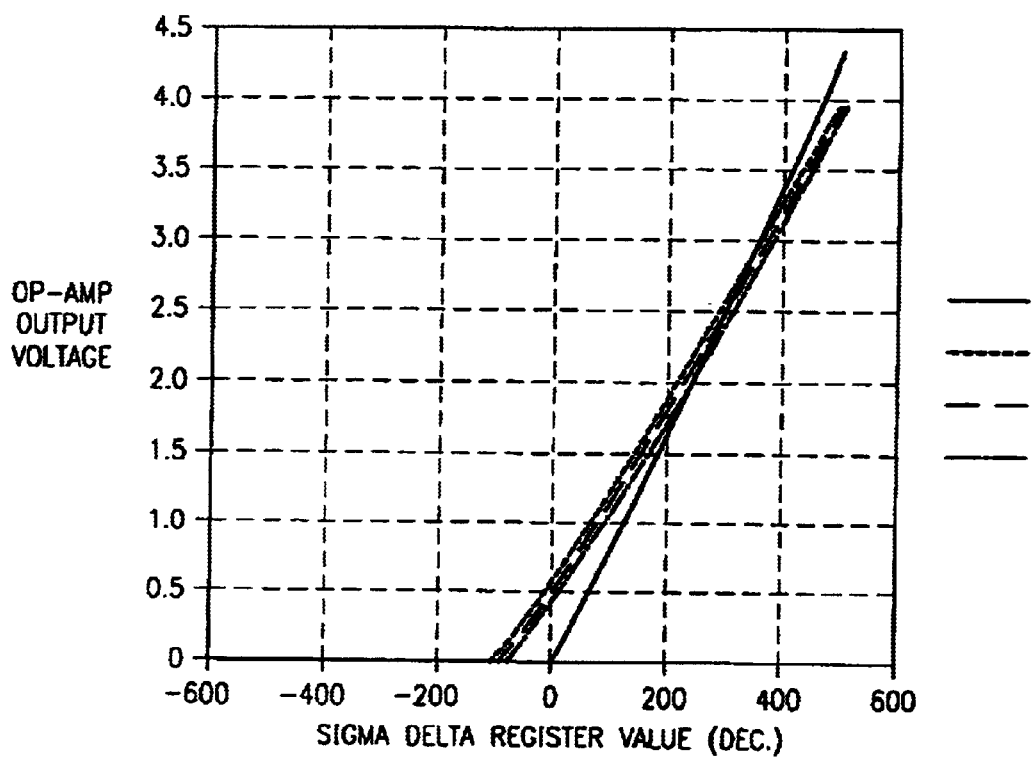
FIG. 4 provides a graph illustrating IF/RF AGC control voltage response to a register value (across temperature)

FIG. 4 "IF AGC control voltage" shows the response of the circuit shown in FIG. 2 to the EA register value, across temperature. The horizontal axis provides the Sigma Delta register value. The output voltage from the interface circuit (vertical axis) controls the IF AGC gain in a manner that compensates for the tuner's gain drift across temperature, thus maintaining a stable AGC gain reading from the LBT4030.

Overall AGC Response with Temperature Compensation

Figure 5:
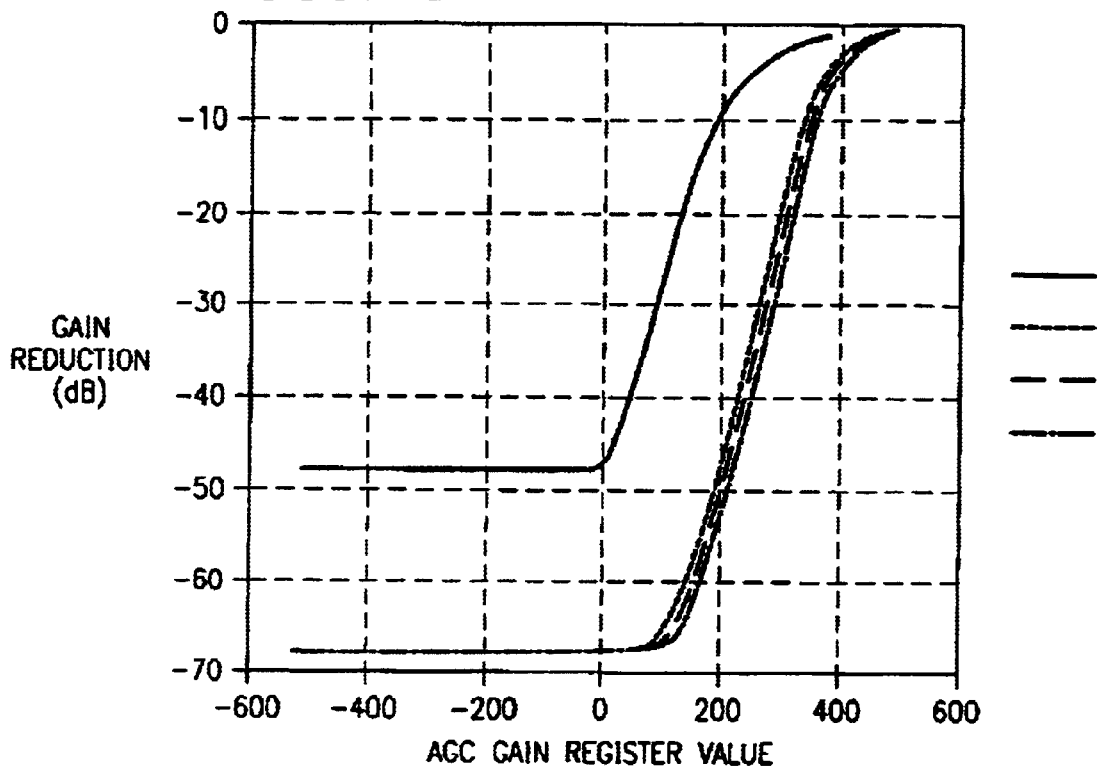
FIG. 5 is a graph showing IF and RF gain reduction responses to a register value, across selected temperatures (for a single frequency)

FIG. 5 is a graph showing IF and RF gain reduction responses to a register value, across selected temperatures (for a single frequency). The AGC response presented in FIG. 5 ("CVA8XMA IF/RF AGC GR response") is an integration of the responses illustrated in FIG. 3 and FIG. 4. In FIG. 5, gain reduction is illustrated on the vertical axis, and AGC gain register value is illustrated across the horizontal axis. Here, applying the TOP scheme will results in a span division.

Figure 6:
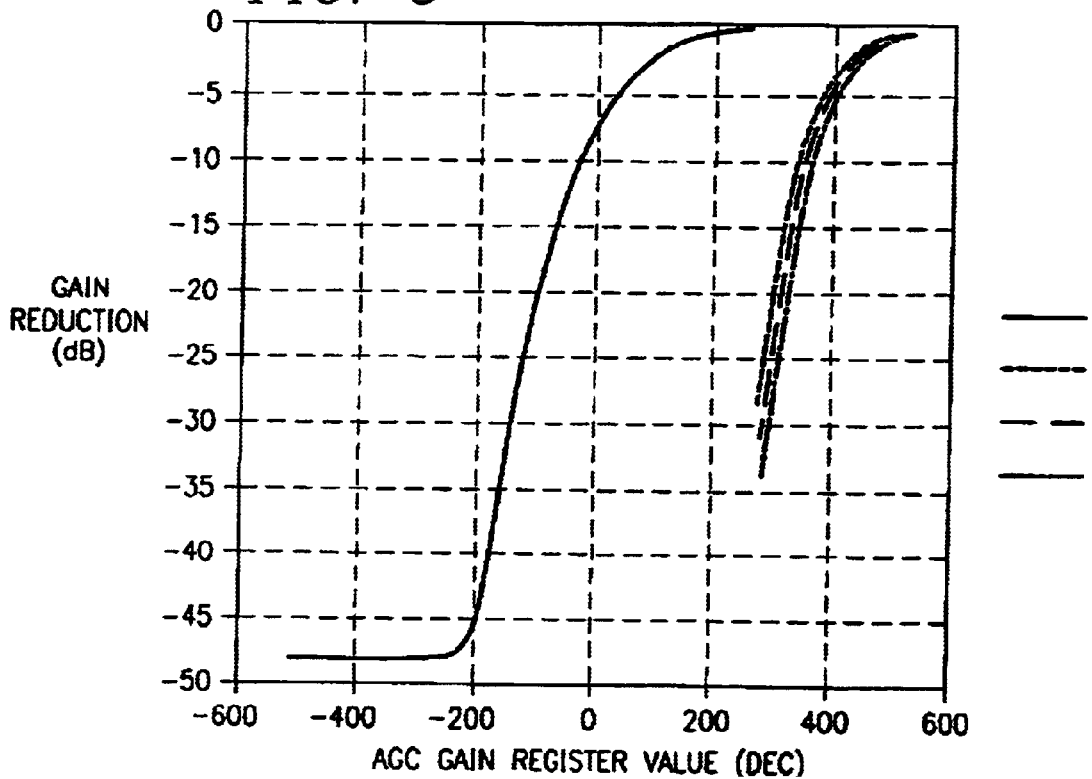
FIG. 6 depicts a graph showing IF and RF gain reduction response with TOP, to a register value, across temperature (for a single frequency)

FIG. 6 depicts a graph showing IF and RF gain reduction response with TOP=277, to a register value, across selected temperatures (for a single frequency). Accordingly, FIG. 6 shows the overall gain reduction response of the tuner's IF and RF AGC due to the 'AGC GAIN' register value in the LBT4030, in conjunction with the interface circuitry. Gain reduction is illustrated on the vertical axis, while AGC gain register values are illustrated across the horizontal axis. The gain variance in the IF AGC over temperature is approximately equal to +/−2.8 dB for about a −15 to about a −3.1 dB gain reduction (which is more than the practical IF span desired to be measured within the DOCSIS power range). As illustrated, values under −240 are not used in the scheme due to RF AGC limitations. This "spare" section is provided in order to cover the RF gain reduction across the input frequency range. It is probable to receive a slope variation over frequency. In high frequency applications, the spare section is often used.

Alternative Solution

Another method of temperature compensation is to measure the ambient temperature inside the CM with a digital readable device. Here, the TOP value power may vary with temperature. However, once the temperature is known, the gain variation due to temperature drift may be calculated out, attributing the 'AGC GAIN' value to actual input power variance as shown above. Typically, calibrations mentioned in the primary mode are still valid for this solution as well.

Calibrating the TOP over frequency

Another effect that shifts the TOP value is the gain response of the tuner over frequency. Frequency variance in the gain will lift the TOP for a given input power level. One method of keeping the TOP input power level constant over frequency is to prepare a calibration table SW, setting the TOP as a function of the tuned frequency. The calibration table may consist of the full number of channels, or more practically, frequency bands which share similar gain. Statistical response of the tuner's gain versus frequency may help if the variance across samples is lower than the specified power measurement accuracy. In this case the calibration table across frequency may be the same over samples, with the exception of a constant gain bias representing the absolute gain variance over samples.

Method of Calibrating

Acquiring a TOP table requires a few acts that may be automated to decrease a calibration time (for each modem). Automation may be accomplished through a digital signal processor (DSP), a computer program, or other automation means. The procedure does not require any intervention within the CM, and may be accomplished on a closed box at room temperature.

Figure 7:
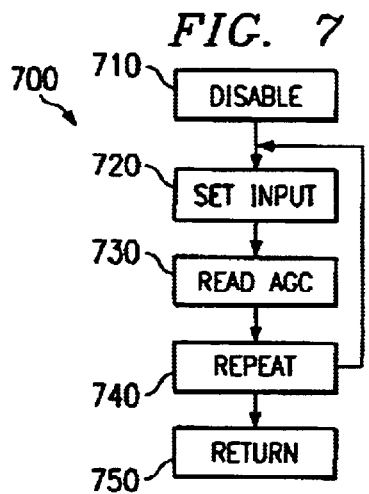
FIG. 7 provides a calibration algorithm.

Accordingly, FIG. 7 provides a calibration algorithm 700. The calibration algorithm 700 begins with a disable act 710. In the disable act 710 the TOP operation of the LBT4030 is disabled by setting register 0x3 to 0x2801 (which is the default value). Instead of disabling the TOP, the TOP may be set to the point to the lowest value (0x200) in register Ox1, at which the TOP will never actually be reached. Next, in a set input act 720, the input RF power is set where TOP is required. Preferably, the input RF power is set from about –5 to about –9 dBmV.

Next, in a read AGC act 730, the AGC GAIN value on the LBT4030 latched registers 0xA and 0xB is read. Then, in a repeat act 740, the set in put act 720 and the read AGC act 730 are repeated over the desired frequency ranges. After the frequency ranges are read, in a return act 750 the LBT4030 is returned to TOP operation, and the read AGC values are set as the TOP values for the appropriate tuned frequencies.

Calibrating the TOP Over Samples

Statistical information of the tuner samples may reduce the need of sample calibration, if the variance is lower than the measurement accuracy required. In most practical, low cost, single conversion tuners this is not the case. Therefore, the need for calibrating each sample is substantial. Thus, due in part to variance of the absolute gain and the frequency response, a calibration for each sample is preferred.

Using the TOP Level for Power Measurement

Once the TOP power is established for a stable level access frequency, temperature, and samples, a conversion table for the 'AGC GAIN' values read from the LBT4030 may be constructed.

IF AGC Control Span

When Pin <=TOP power level, the IF AGC is active. Any 'AGC GAIN' value>TOP value represents an input power lower than the TOP power level. Defining the actual level may be done using the response given in FIG. 6, where each 'AGC GAIN' value is referred to a relative GR, which may be referred to as the TOP power. For example, the TOP was set to 277 in the example above. Assuming this is equivalent to a RF input level of –5 dBmV, for an 'AGC GAIN' value of 300, a gain difference of about 8 dB relative to TOP is obtained (which is translated to –13 dBmV).

IF AGC Calibration

The general procedure for obtaining the input power relation to the 'AGC GAIN' values in the IF section would be to input the required power span, and to record the 'AGC GAIN' with its corresponding power level. This procedure will typically provide accurate measurements over samples. However, because the IF AGC is not frequency dependant, the response may be predicted, and a curve definition may be derived. This eliminates the need to calibrate. In the example above and illustrated in FIG. 6, the IF GR response to 'AGC GAIN' values around the TOP may be linearly approximated resulting in a dB/LSB (dB per Least Significant Bit) number. In the example, the slope is approximately 0.33 [dB/LSB], which returns a (300–277)*0.33=7.67 [dB].

RF AGC control span

When Pin>TOP power level, the RF AGC is generally active. Practically, any 'AGC GAIN' value<TOP value represents an input power higher than the TOP power level. Defining the actual level may be done using the response given in FIG. 6, where each 'AGC GAIN' value is referred to a relative GR, that may be referred to as TOP power. For example, the TOP was set to 277 in the example above. Assuming that this is equivalent to an RF input level of –5 dBmV, for an 'AGC GAIN' value of 0 a gain difference of about 7.5 dB relative to TOP is obtained (which is translated to 2.5 dBmV).

RF AGC Calibration

The general procedure for obtaining the input power relation to the 'AGC GAIN' values in a RF are similar to the IF. However, it must be done over frequency (due to the GR variance of the RF AGC). The frequency dependence, and the RF AGC curve used, make it difficult to obtain an analytic approximation. Therefore, calibration over power is preferred. The power versus 'AGC GAIN' values across frequency calibration may be performed in conjunction with TOP calibration over frequency. The procedure, per frequency, is to input the required power span and record the 'AGC GAIN' with its corresponding power level.

The input power increments are dependent on the AGC response and the level of interpolation done between measured pints. For example, in FIG. 6, linear interpolation will require small power increments in the –100 range, and larger increments below –11, because of relative linear response. Another option is to use a logarithmic interpolation, which requires fewer measurement points.

SETTING THE 'AGC GAIN' CONTROL RESOLUTION

An important design related issue is setting the 'AGC GAIN' control resolution. The control span for each of the AGC's (IF or RF) is 1024 states (via a 10 bit register). When working in TOP mode, this span is divided according to the TOP setting. The control resolution referred to in this section is the largest gain variation in dB per LSB. This resolution is determined by the GC slopes, interface gain circuit, and TOP setting. Low resolution will result in a large gain step per LSB. This should not affect the CM's performance so long as the control voltage after the LPF is much slower than a received symbol's duration.

'AGC GAIN' Resolution Affect on Power Measurement

When measuring power, the gain step may cause a non-eligible error. The error may be up to one half of the maximum step value. In the example above, the maximum step of the IF section is approximately 0.33 dB/LSB for the practical range. This resolution may contribute an error of to 0.165 dB in power measurement (which is typically reasonable). The RE maximal step is about 0.33 dB/LSB maximum as well. Of course, in the section of the AGC where the GR response is moderate, a much higher resolution is received (resulting in smaller errors).

Design Considerations for Minimizing Resolution Errors

Improving resolution reduces error introduced from a source. Accordingly, it is desired to improve resolution. Improving the resolution may be done by using an AGC with a moderate slope, using a low gain in the interface circuit, or by planning the TOP for maximum use of the 'AGC GAIN' span.

Although the present invention and its advantages have been described in detail, it should be understood that various changes, substitutions and alterations can be made herein without departing from the spirit and scope of the invention as defined by the following claims.

What is claimed is:

1. A method of calibrating a broadband communications device, comprising:

disabling a TOP operation;

setting a RF input power;

reading an AGC GAIN value; and setting the broadband communications device based on the read AGC value.

2. A method of claim 1 further comprising the act of returning to TOP operation.

3. A method of claim 1 further comprising setting the broadband communications device to a first predetermined frequency.

4. A method of claim 3 further comprising setting the broadband communications device to a second predetermined frequency.

5. A method of claim 4 further comprising setting the RF input power at the second predetermined frequency.

6. A method of claim 5 further comprising reading a second AGC GAIN value based on the second predetermined frequency.

7. A method of claim 6 further comprising setting the read AGC values as the TOP values for appropriate tuned frequencies.

8. A broadband communications device capable of being calibrated by:

disabling a TOP operation;

setting a RF input power;

reading an AGC GAIN value; and setting the broadband communications device based on the read AGC value.

9. The broadband communications device of claim 8 further comprising setting the broadband communications device to a first predetermined frequency, and setting the broadband communication device to a second predetermined frequency.

10. The broadband communications device of claim 9 further comprising setting the RF input power to the second predetermined frequency and reading a second AGC GAIN value based on the second predetermined frequency.

* * * * *